United States Patent [19]

Yoshida

[11] Patent Number: 5,262,349
[45] Date of Patent: Nov. 16, 1993

[54] METHOD FOR PRODUCING A II-VI COMPOUND SEMICONDUCTOR DEVICE INCLUDING MERCURY

[75] Inventor: Yasuaki Yoshida, Itami, Japan

[73] Assignee: Mitsubishi Denki Kabushiki Kaisha, Tokyo, Japan

[21] Appl. No.: 931,368

[22] Filed: Aug. 18, 1992

[30] Foreign Application Priority Data

Mar. 3, 1992 [JP] Japan .................. 4-83345

[51] Int. Cl.$^5$ .................. H01L 21/385; H01L 21/324
[52] U.S. Cl. .................. 437/160; 437/987; 156/DIG. 82; 148/DIG. 64
[58] Field of Search .............. 437/134, 135, 139, 140, 437/160, 247, 965, 987; 156/DIG. 73, DIG. 82; 148/DIG. 3, DIG. 63, DIG. 64

[56] References Cited

U.S. PATENT DOCUMENTS

| | | | |
|---|---|---|---|
| 4,462,959 | 7/1984 | Tregilgas | 437/159 |
| 4,588,446 | 5/1986 | Tregilgas | 437/160 |
| 4,927,773 | 5/1990 | Jack et al. | 437/987 |
| 4,960,728 | 10/1990 | Schaake et al. | 148/DIG. 64 |
| 5,028,296 | 7/1991 | Tregilgas | 156/DIG. 82 |

FOREIGN PATENT DOCUMENTS 62-34157  7/1987  Japan .

*Primary Examiner*—Brian E. Hearn
*Assistant Examiner*—C. Chaudhari
*Attorney, Agent, or Firm*—Leydig, Voit & Mayer

[57] ABSTRACT

In a method for producing a II-VI compound semiconductor device including mercury, a thin film of a group II element or a group II element compound, which is a solid at room temperature, is deposited on a surface of a p type II-VI compound semiconductor. Annealing is carried out to diffuse the group II element from the thin film into the p type II-VI compound semiconductor whereby a region of the p type II-VI compound semiconductor on which the thin film is present is converted to n type, resulting in a p-n junction. Therefore, instruments and materials are easily handled, increasing work efficiency and productivity. In addition, the annealing is carried out without a complicated temperature profile, resulting in a simple process.

5 Claims, 6 Drawing Sheets

5,262,349

METHOD FOR PRODUCING A II-VI COMPOUND SEMICONDUCTOR DEVICE INCLUDING MERCURY

FIELD OF THE INVENTION

The present invention relates to a method for producing a semiconductor device and, more particularly, to a method for controlling the conductivity type of a II-VI semiconductor including mercury which is used as a material of an infrared detector.

BACKGROUND OF THE INVENTION

A compound semiconductor comprising a II-VI mixed crystal, such as a CdHgTe crystal, has the property that energy band gap thereof is changed by changing the composition ratio of the crystal, so that it is used in a low-noise photodetector and the like.

FIG. 4 is a schematic diagram for explaining a process for controlling conductivity type in a method for producing a II-VI compound semiconductor device, disclosed in Japanese Published Patent Application 62-34157. In FIG. 4, a CdHgTe crystal 2 is enclosed in a quartz ampoule 1 with mercury 3 which is liquid at room temperature. The mercury 3 is separated from the CdHgTe crystal 2 by the narrow part 1a of the ampoule 1, i.e., a mercury reservoir is provided at an end of the ampoule 1. Heaters 12 are disposed in the neighborhood of the ampoule 1.

Since mercury (Hg) has a very high vapor pressure, Hg is dissociated from the CdHgTe crystal 2 during the crystal growth, resulting in vacancies in the CdHgTe crystal. The vacancies serve as acceptors. For example, a CdHgTe crystal grown by liquid phase epitaxy (LPE) includes a lot of Hg vacancies and has a p type carrier concentration as high as $10^{17} cm^{-3}$, so that the mobility of carriers is low. Therefore, it is impossible to use the CdHgTe crystal for a semiconductor device. In order to solve this problem, as shown in FIG. 4, the CdHgTe crystal 2 is loaded in the ampoule 1 with mercury 3, the ampoule is evacuated to $10^{-6}$ Torr, and annealing is carried out at an appropriate temperature using the heaters 12. During the annealing, Hg partial pressure from the mercury 3, which is produced in the ampoule, is applied to the CdHgTe crystal 2 to fill the vacancies in the crystal, whereby the CdHgTe crystal having such a high carrier concentration is converted to a p type CdHgTe crystal having a low carrier concentration. If the Hg partial pressure is applied to the crystal until most of the vacancies are filled, an n type CdHgTe crystal is obtained.

The annealing process for reducing carrier concentration of the CdHgTe crystal will be described in more detail using the temperature profile of FIG. 5. The CdHgTe crystal 2 in the ampoule 1 is heated up to 280° C. while the mercury 3 is heated to 250° C., whereby an Hg partial pressure is applied to the CdHgTe crystal 2. The CdHgTe crystal 2 and the mercury 3 are kept in this state for about twenty four hours to diffuse Hg into the CdHgTe crystal 2 without Hg being applied to the inner wall of the ampoule 1, resulting in an n type CdHgTe crystal having a carrier concentration of approximately $10^{14} cm^{-3}$.

FIGS. 6(a) and 6(b) are schematic diagrams for explaining a method for producing p-n junctions in a II-VI compound semiconductor by diffusing mercury. A diffusion mask 4 comprising Zn and having a thickness of about 1 micron is disposed on a p type CdHgTe crystal 5 about 10 microns thick. A plurality of apertures 4a each having a diameter of about 1 to 30 microns are formed through the diffusion mask 4.

The CdHgTe crystal 5 with the diffusion mask 4 is loaded in a quartz ampoule with mercury as shown in FIG. 4 and annealed. During the annealing, the prescribed Hg partial pressure is applied to the surface of the CdHgTe crystal 5 exposed in the apertures 4a of the diffusion mask 4, whereby n type regions are formed as shown in FIG. 6(b), resulting in p-n junctions 6 at a depth of about 3 microns.

FIGS. 7(a)-7(e) are cross-sectional views of steps in a method for producing, for example, a photodiode array using the p-n junctions 6. After the p-n junctions 6 are formed in the CdHgTe crystal 5 as shown in FIG. 7(a), the diffusion mask 4 is removed as shown in FIG. 7(b). Then, an oxide film 101 is deposited on the entire surface of the CdHgTe crystal 5 as shown in FIG. 7(c). Subsequently, n side contact holes 102 are formed in film 101 at the n type regions and a p side contact hole 103 is formed in film 101 at on the CdHgTe crystal 5 using a conventional photolithography as shown in FIG. 7(d). Then, a metal layer is deposited on the wafer and patterned as shown in FIG. 7(e), resulting in n side electrodes 104 connecting to the CdHgTe crystal 5 through the contact holes 102 and 103 and a p side electrode 105 connecting to the CdHgTe crystal 5 through the contact hole 103.

In Japanese Patent Published Application No. 58-171848, a small quantity of group III element, such as indium, is added as a donor impurity during the growth of a CdHgTe crystal and then annealing is carried out to control the quantity of Hg in the CdHgTe crystal, whereby carrier concentration is controlled. Meanwhile, in Japanese Patent Published Application No. 62-13085, a bump electrode comprising indium is formed on a CdHgTe layer and then annealing is carried out to convert a region of the CdHgTe layer, on which the bump electrode is present, to n type. In these conventional methods, however, the indium as a donor impurity becomes a scattering center in the crystal, so that the mobility of carriers is not much improved, resulting in a semiconductor device with poor electrical characteristics.

In the above-described methods for producing semiconductor devices, the mercury, which is liquid at a room temperature, is used as a means for applying Hg vapor pressure to the II-VI crystal including mercury atoms. Therefore, if the ampoule is inclined, the mercury moves and it is difficult to obtain a desired temperature profile. Therefore, the ampoule should be treated with the greatest possible care, with the result that the work efficiency is unfavorably reduced.

In addition, as shown in the temperature profile of FIG. 5, the annealing should be carried out with the CdHgTe crystal 2 kept 30° C. warmer than the Hg reservoir, to avoid Hg from adhering to the inner wall of the ampoule, and this results in a complicated process. In addition, when the group III element is used as a donor impurity, it acts as a scattering center and the mobility of carriers is not improved.

SUMMARY OF THE INVENTION

It is an object of the present invention to provide a method for producing a semiconductor device, in which instruments and materials are easily handled with high work efficiency and control of the conductivity type of a II-VI semiconductor crystal including mercury and production of a p-n junction in the II-VI semiconductor crystal are performed in a simple process without using a donor impurity.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a group II element is diffused into a II-VI crystal including mercury, using a group II element or a group II element compound, which is a solid at room temperature, as a diffusion source, to control the conductivity type of the crystal. Therefore, instruments and materials are easily handled and an annealing for diffusion is carried out with a uniform temperature profile.

According to a second aspect of the present invention, a thin film comprising a group II element or a group II element compound, which is solid at a room temperature, is formed on a surface of a p type II-VI compound semiconductor and then annealing is carried out to diffuse the group II element into a region of the p type II-VI compound semiconductor, on which the thin film is present, to convert the region to n type, whereby a p-n junction is formed. Therefore, instruments and materials are easily handled, and the annealing is carried out with a uniform temperature profile.

DETAILED DESCRIPTION OF THE PREFERRED EMBODIMENTS

Figure 4:
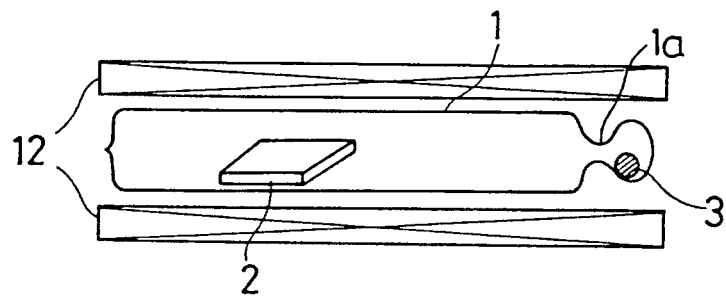
FIG. 4 is a schematic diagram for explaining a method for controlling the conductivity type of a CdHgTe crystal in accordance with the prior art.
Figure 5:
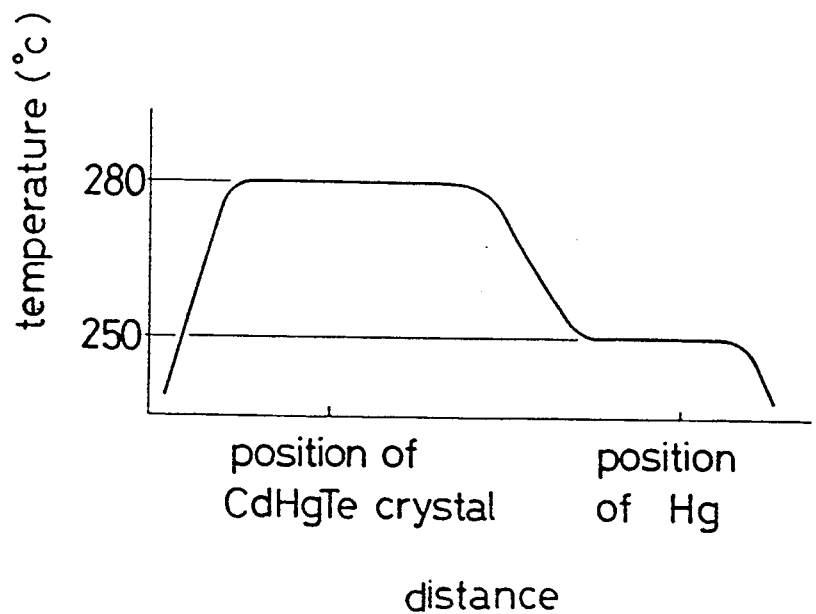
FIG. 5 is a diagram showing a temperature profile used in the method shown in FIG. 4.
Figure 6A:
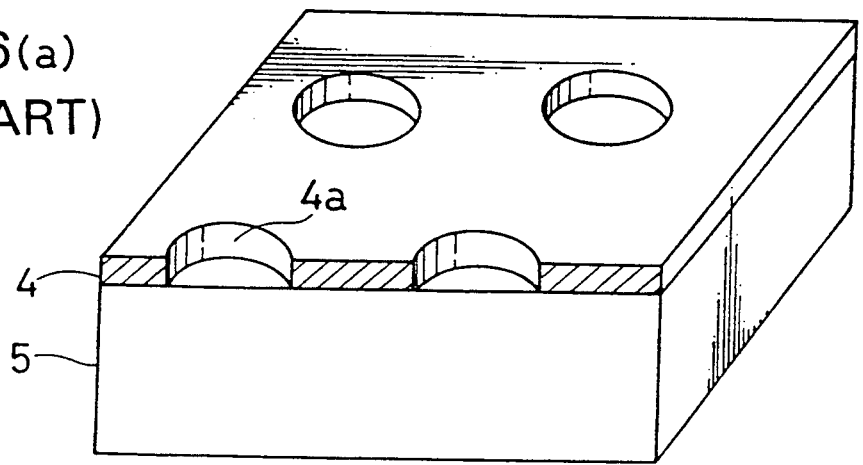
FIGS. 6(a) and 6(b) are diagrams of steps in a method for producing p-n junctions in a p type CdHgTe crystal in accordance with the prior art.
Figure 6B:
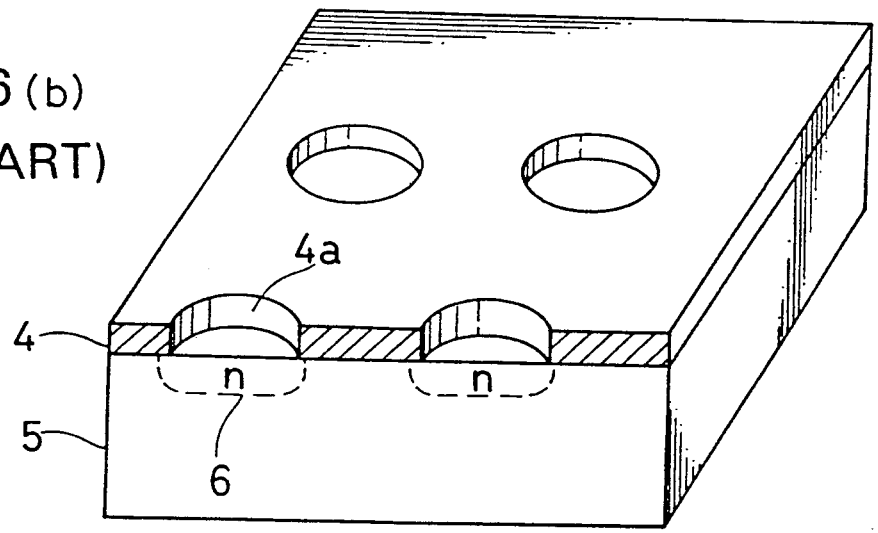
Figure 7A:
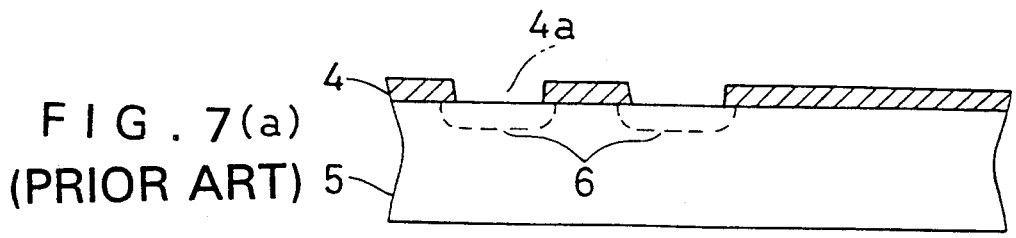
FIGS. 7(a)-7(e) are sectional views of steps in a method for producing a photodiode array in accordance with the prior art.
Figure 7B:
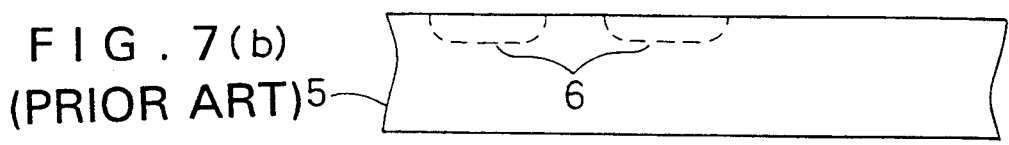
Figure 7C:
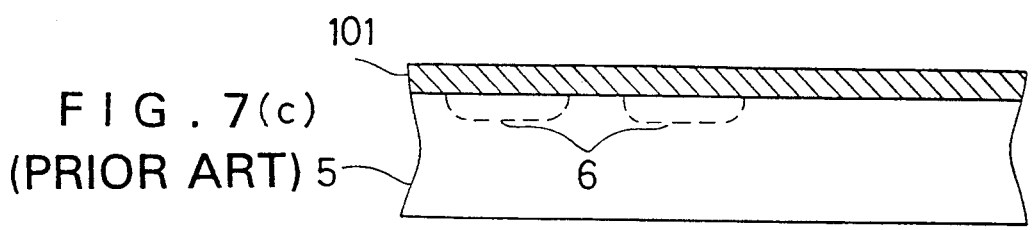
Figure 7D:
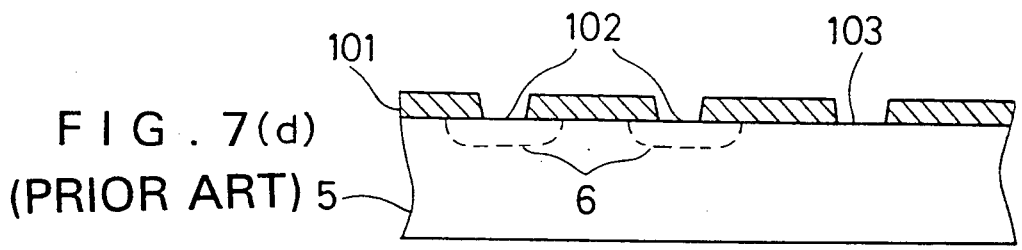
Figure 7E:
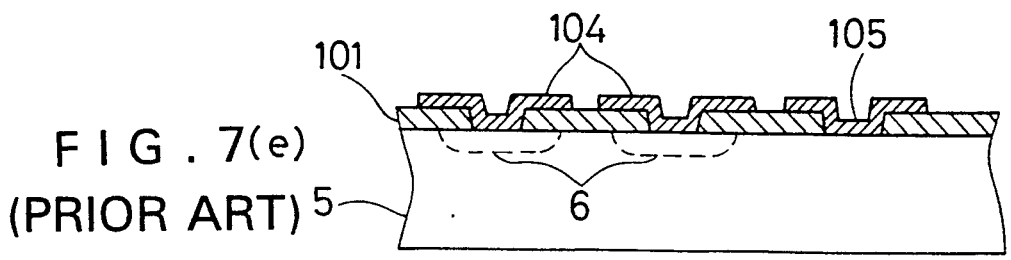

FIGS. 1(a)-1(d) are schematic diagrams illustrating steps in a method for producing a semiconductor device in accordance with a first embodiment of the present invention. In FIG. 1, the same reference numerals as in FIG. 4 designate the same or corresponding parts. A thin Zn film about 1000 angstroms thick 7 is disposed on a surface of a CdHgTe crystal 2 about 10 microns thick.

Figure 1A:
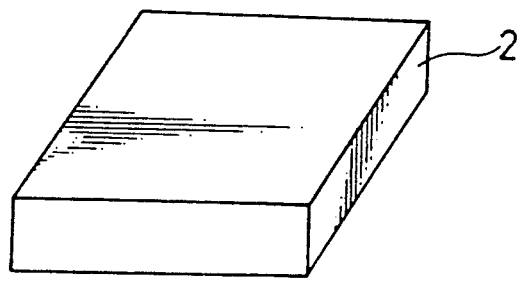
FIGS. 1(a)-1(d) are diagrams of steps in a method for controlling the conductivity type of a CdHgTe crystal in accordance with a first embodiment of the present invention.
Figure 1B:
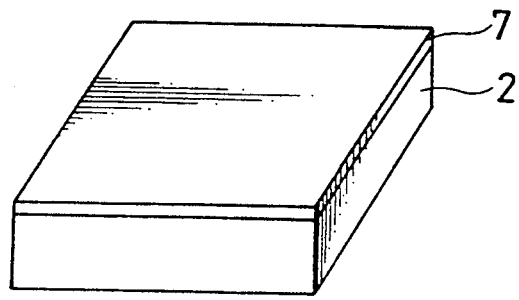
Figure 1C:
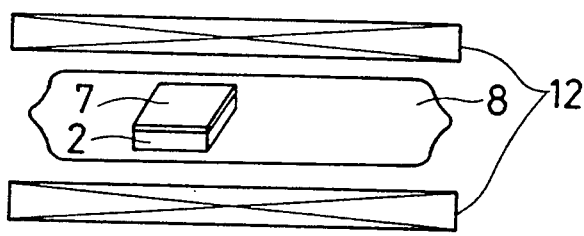
Figure 1D:
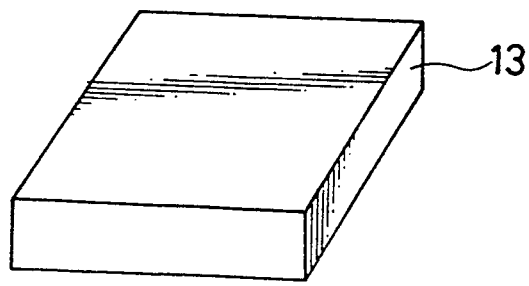

First of all, a CdHgTe crystal 2 shown in FIG. 1(a) is prepared. Then, a thin Zn film 7 about 1000 angstroms thick is deposited on the surface of the CdHgTe crystal 2 by sputtering or the like as shown in FIG. 1(b). Then, as shown in FIG. 1(c), this wafer is loaded in an ampoule 8 and the ampoule 8 is evacuated to $10^{-6}$ Torr. Then, the wafer is annealed at 200° for twenty hours using the heater 12. During the annealing, Zn diffuses into the CdHgTe crystal and fills Hg vacancies in the CdHgTe crystal 2. After the annealing, the wafer is taken out of the ampoule 8 and the thin Zn film is removed by etching, providing an n type CdHgTe crystal 13 having a carrier concentration of about $10^{14} cm^{-3}$ as shown in FIG. 1(d).

According to the first embodiment of the present invention, Zn, which is a solid at a room temperature, is used for filling the acceptors in the CdHgTe crystal 2. More specifically, the thin Zn film 7 is deposited on the CdHgTe crystal 2 and annealed to diffuse the Zn into the CdHgTe crystal 2. Therefore, the materials are easily treated, increasing the work efficiency. In addition, since the annealing is carried out with a uniform temperature profile, the process is simplified. In addition, since Zn is a group II element like Cd and Hg, it fills vacancies and combines with a group VI element, so that Zn does not act as a scattering center, with the result that the carrier mobility is significantly improved.

Figure 2A:
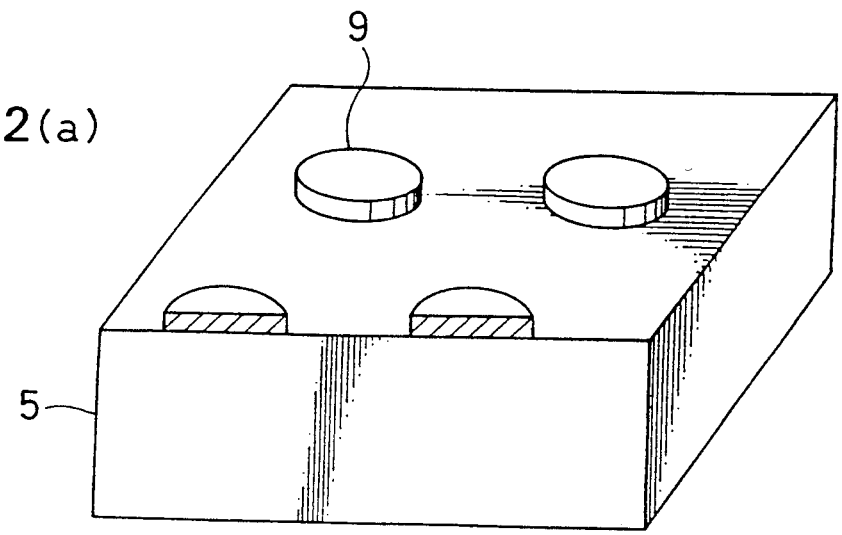
FIGS. 2(a) and 2(b) are diagrams of steps in a method for producing p-n junctions in a CdHgTe crystal in accordance with a second embodiment of the present invention.
Figure 2B:
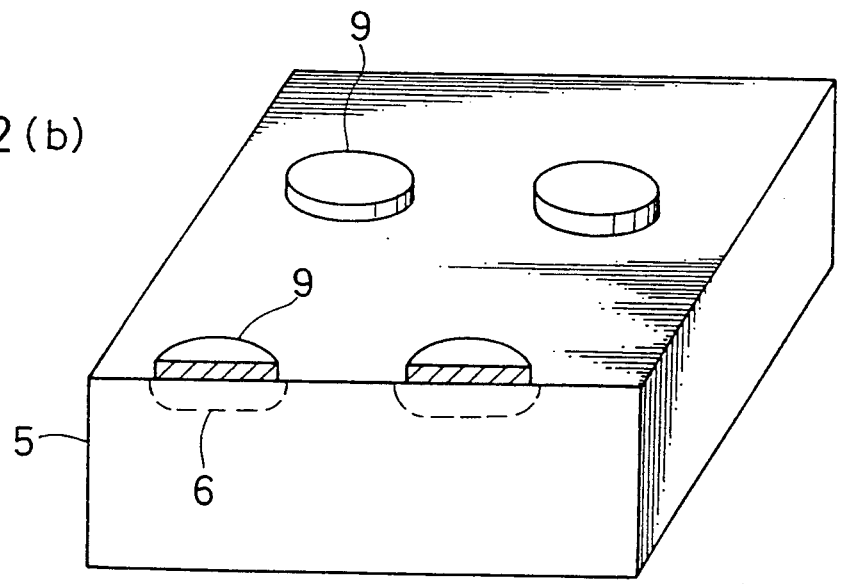

FIGS. 2(a) and 2(b) are schematic diagrams illustrating steps in a method for producing p-n junctions of a photodiode array in accordance with a second embodiment of the present invention.

First of all, as shown in FIG. 2(a), a plurality of thin Zn films each having a thickness of about 1000 angstroms and a diameter of about 1 to 30 microns are formed on a surface of a p type CdHgTe crystal 5 about 10 microns thick by a transcribing technique. Then, this wafer is loaded in the ampoule in the same manner as described in the first embodiment and annealed at 200° C. for about ten hours. During the annealing, Zn diffuses into regions in the CdHgTe crystal 5 where the Zn films are present, resulting in n type regions having a carrier concentration of about $10^{14} cm^{-3}$. Thus, p-n junctions 6 are formed at a depth of about 3 microns in the CdHgTe crystal 5, as shown in FIG. 2(b).

Figure 3:
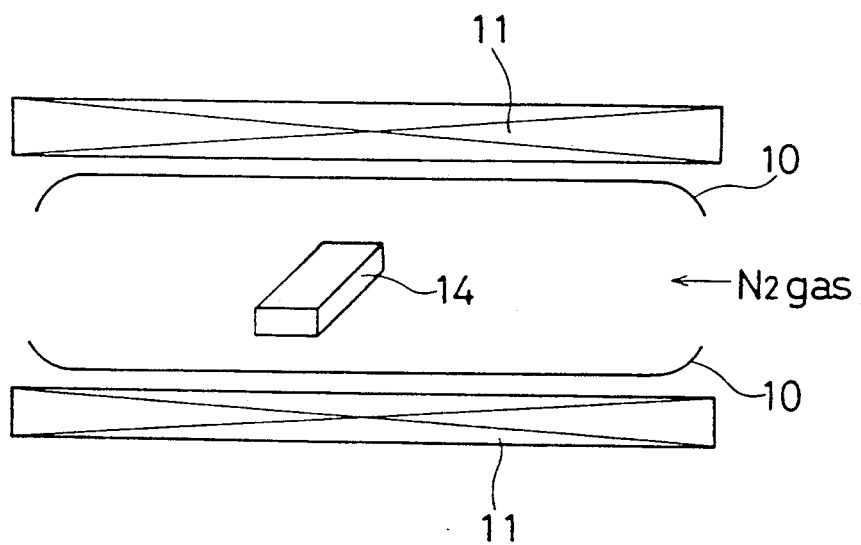
FIG. 3 is a schematic diagram for explaining an annealing process using an open-tube type annealing furnace in accordance with the first and second embodiments of the present invention.

In the above-described embodiments, although the CdHgTe crystal 2 (5) with the thin Zn film is set in the ampoule under vacuum and annealed, an open-tube type annealing furnace shown in FIG. 3 may be used because Zn is a solid at room temperature and there is no concern regarding vapor pressure, in contrast with Hg. In FIG. 3, reference numeral 10 designates a quartz tube and reference numeral 14 designates a CdHgTe crystal on which a thin Zn film is formed.

During the annealing, nitrogen gas or the like is introduced into the quartz tube 10 while heating the quartz tube at a desired temperature with the heater 11, whereby Zn diffuses into the CdHgTe crystal. Since the open tube 10 is used instead of an ampoule, the step of evacuating the ampoule is dispensed with. Therefore, this method is suitable for use with a large-sized wafer. In this case, however, the reproducibility of the process is reduced a little.

While in the above-described embodiments Zn is used as a group II element, other group II elements or group II element compounds may be used with the same effects as described above.

While in the above-described embodiments the CdHgTe crystal is used as a II-VI compound semiconductor including Hg, other II-VI compound semiconductors including Hg may be used.

As is evident from the foregoing description, according to the present invention; a group II element, such as Zn, is diffused into a group II-VI crystal including Hg, using a group II element or a group II element compound, which is a solid at room temperature, as a diffusion source, whereby the conductivity type of the group II-VI crystal including Hg is controlled, or p-n junctions are formed in the group II-VI crystal including Hg. Therefore, instruments and materials are easily handled, increasing work efficiency and productivity. In addition, annealing for the diffusion is carried out without using a complicated temperature profile, resulting in a simple process.

What is claimed is:

1. A method for producing a semiconductor device including controlling the conductivity type of a p type II-VI compound semiconductor including mercury comprising:

depositing a thin film selected from the group consisting of zinc and zinc compounds on a surface of a p type II-VI compound semiconductor including mercury; and annealing said thin film and said p type II-VI compound semiconductor including mercury at an elevated temperature for less than one day to diffuse zinc into said p type II-VI compound semiconductor including mercury whereby a region of said p type II-VI compound semiconductor including mercury adjacent said thin film is converted to n type conductivity, resulting in a p-n junction.

2. The method of claim 1 including annealing at atmospheric pressure.

3. The method of claim 1 wherein the p type II-VI compound semiconductor including mercury is CdHgTe.

4. The method of claim 3 including annealing at about 200° C. for about ten hours in a nitrogen ambient at atmospheric pressure.

5. The method of claim 1 including annealing at about 200° C. for about twenty hours in an evacuated ampoule.

* * * * *